(12) United States Patent
Sasaki

(10) Patent No.: US 6,853,542 B2
(45) Date of Patent: Feb. 8, 2005

(54) VIDEO-APPARATUS-TUNER MOUNTING BOARD

(75) Inventor: Michinori Sasaki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/256,742

(22) Filed: Sep. 27, 2002

(65) Prior Publication Data

US 2003/0063225 A1 Apr. 3, 2003

(30) Foreign Application Priority Data

Oct. 2, 2001 (JP) ........................................ 2001-306053

(51) Int. Cl.[7] ................................................ G06F 1/16
(52) U.S. Cl. ........................ 361/679; 361/736; 361/743
(58) Field of Search .............................. 361/679, 736, 361/743, 748, 772, 774, 777, 783

(56) References Cited

U.S. PATENT DOCUMENTS

RE30,274 E * 5/1980 Bolon et al. ................. 361/411
5,128,500 A * 7/1992 Hirschfeld ................... 200/5 R

FOREIGN PATENT DOCUMENTS

JP 2000-165761 6/2000

* cited by examiner

Primary Examiner—Yean-Hsi Chang
(74) Attorney, Agent, or Firm—Brinks Hofer Gilson & Lione

(57) ABSTRACT

A video-apparatus-tuner mounting board includes a television tuner mounted on the board; a predetermined circuit to be connected to pins connected to an internal circuit of the television tuner; through holes arranged in a line, into which pins are inserted; and conductor lands, formed around the through holes, to be connected to the pins. Of the conductor lands, first conductor lands connected to the pins of a specific television tuner to be mounted on the board are connected to the predetermined circuit and to second conductor lands, which are not connected to the pins of the specific television tuner.

4 Claims, 4 Drawing Sheets

VIDEO-APPARATUS-TUNER MOUNTING BOARD

BACKGROUND OF THE INVENTION

1. Field of the Invention

The present invention relates to video-apparatus-tuner mounting boards for mounting television tuners used in video apparatuses, such as television receivers and recorders/players.

2. Description of the Related Art

Known video apparatuses use specific television tuners and hence use motherboards for mounting the corresponding television tuners. FIG. 4 shows a television tuner (hereinafter referred to as a tuner) 30 for use in a known video apparatus. The tuner 30 includes a main body 30a for containing circuits, which are stored in a metal casing having the shape of a rectangular parallelepiped, and a plurality of pins 30b, which are mounted to penetrate from a first face of the main body 30a.

At present, the mounting position of each pin 30b is standardized, and the pins 30b are mounted at predetermined intervals. There are approximately twenty positions at which the pins 30b can be mounted. Of these positions, only the necessary quantity of pins 30b is mounted in accordance with the individual tuner. Each pin 30b is connected to a corresponding circuit in the interior of the main body 30a.

A motherboard 31 includes through holes 31a, which are arranged in a line, corresponding to the pins 30b of the tuner 30. The tuner 30 is mounted on the motherboard 31. The pins 30b are inserted into the through holes 31a.

As shown in FIG. 4, the motherboard 31 includes conductor lands 31b around the through holes 31a into which the pins 30b of the tuner 30 are inserted. The conductor lands 31b are connected through wiring conductors 31c to a predetermined circuit (not shown) located at a different position on the motherboard 31.

The pins 30b of the tuner 30 inserted into the through holes 31a are soldered to the conductor lands 31b.

As described above, a motherboard has through holes corresponding to pins of a specific tuner, and the motherboard is also provided with wiring. When pins of a different tuner are mounted at predetermined intervals, if the motherboard has no corresponding through holes, the pins of the different tuner cannot be connected to the motherboard. Even when the motherboard has through holes corresponding to the pins of the different tuner, if the pin arrangement is different, the pins cannot be connected to a predetermined circuit on the motherboard. The use of a different tuner requires redesigning of the motherboard, which requires a lot of design man-hours. Also, an increase in the number of types of motherboards requires a lot of management man-hours.

SUMMARY OF THE INVENTION

Accordingly, it is an object of the present invention to enable one motherboard to be shared by a plurality of tuners having different pin arrangements.

In order to achieve the foregoing objects, according to an aspect of the present invention, a video-apparatus-tuner mounting board is provided including a television tuner mounted on the board; a predetermined circuit to be connected to pins connected to an internal circuit of the television tuner; through holes arranged in a line, into which the pins are inserted; and conductor lands, formed around the through holes, to be connected to the pins. Of the conductor lands, first conductor lands connected to the pins of a specific television tuner to be mounted on the board are connected to the predetermined circuit and to second conductor lands, which are not connected to the pins of the specific television tuner. Accordingly, the provision of pins of another television tuner with a different pin arrangement at positions corresponding to the positions of open pins of the specific television tuner enables the motherboard to be shared by the specific television tuner and the other television tuner without changing the motherboard.

According to another aspect of the present invention, a video-apparatus-tuner mounting board is provided including a television tuner mounted on the board; a predetermined circuit to be connected to pins connected to an internal circuit of the television tuner; through holes arranged in a line, into which the pins are inserted; and conductor lands, formed around the through holes, to be connected to the pins. Of the conductor lands, first conductor lands connected to the pins of a specific television tuner to be mounted on the board are connected to the predetermined circuit and connected via first switches to third conductor lands connected to the pins of the specific television tuner. The third conductor lands are connected to the predetermined circuit via second switches. The opening and closing operation of the first switches is opposite from that of the second switches. When using the specific television tuner, the first switches are opened while the second switches are closed. This enables the specific television tuner to be used. When using another television tuner, the first switches are closed while the second switches are opened. This enables pins of the other television tuner to be connected to the predetermined circuit through the conductor lands connected to the pins of the specific television tuner. Even when functions of a pin corresponding to the same mounting position differ among television tuners, the same through hole and the corresponding conductor lands can be shared.

A plurality of the through holes corresponding to the first conductor lands may be consecutively located at one end of the line. Since the other television tuner use no first through holes, the other television tuner can be miniaturized compared with the specific television tuner.

DESCRIPTION OF THE PREFERRED EMBODIMENTS

Figure 1:
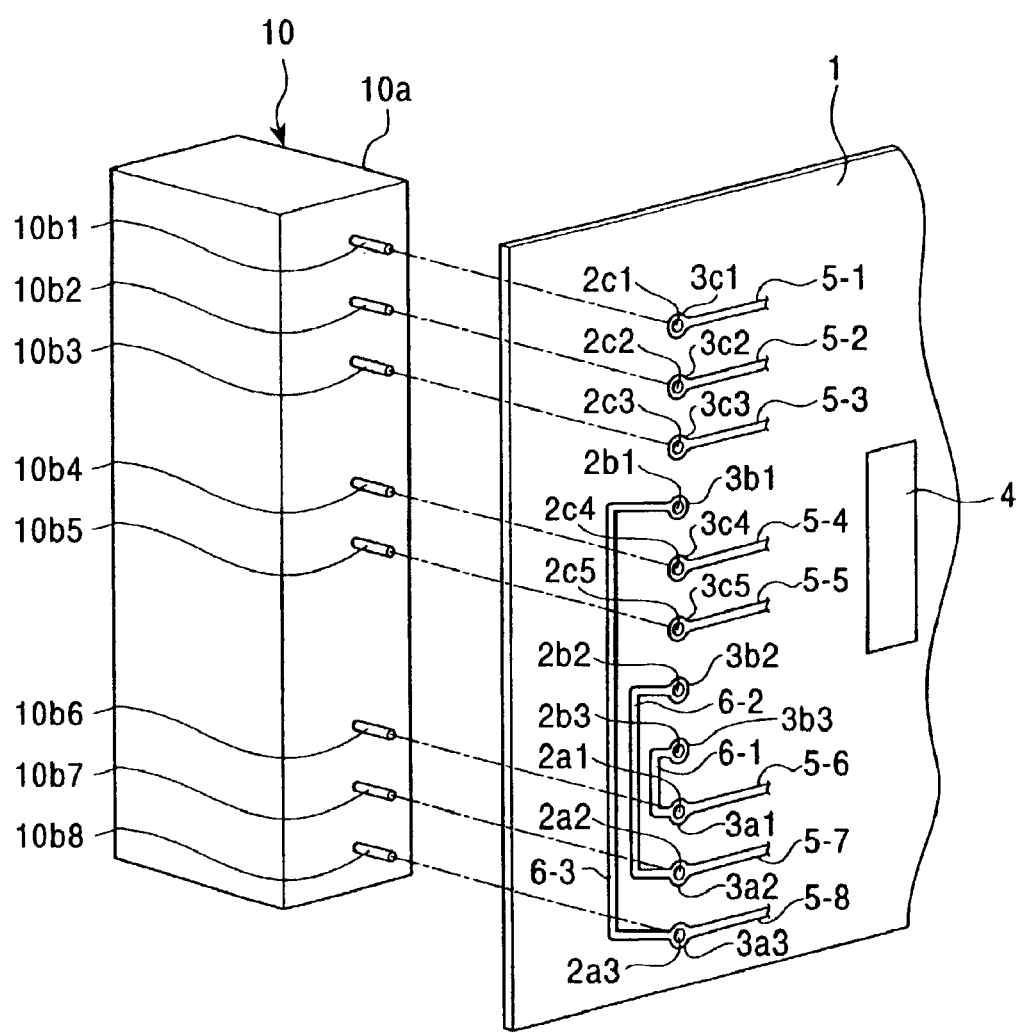
FIG. 1 is an exploded perspective view of a video-apparatus-tuner mounting board according to the present invention.

FIG. 1 shows a video-apparatus-tuner mounting board (hereinafter referred to as a motherboard) 1 according to the present invention, a specific television tuner (hereinafter referred to as a specific tuner) 10 to be mounted on the motherboard 1, and another television tuner (hereinafter referred to as the other tuner) 10 to be mounted on the motherboard 1. The specific tuner 10 includes a main body 10a for containing circuits in a metal casing having the shape of a rectangular parallelepiped and a plurality of pins 10b (10b1 to 10b8), which are mounted in a line to penetrate from a first face of the main body 10a.

At present, it has been standardized that the pins 10b are to be mounted at a total of approximately twenty positions at predetermined intervals. Practically, the necessary quantity of pins is mounted in accordance with the individual television tuner (eight pins are mounted in the example shown in FIG. 1). Thus, there may be two or more spaces between the adjacent pins. Each pin 10b is connected to a corresponding circuit in the interior of the main body 10a.

The motherboard 1 includes through holes 2 (first through holes 2a1 to 2a3, second through holes 2b1 to 2b3, and third through holes 2c1 to 2c5), which are arranged in a line at the predetermined intervals. The first through holes 2a1 to 2a3 are located at one end of the line. No pins lob of the specific tuner 10 are inserted into the second through holes 2b1 to 2b3. The pins 10b are inserted into the through holes 2c1 to 2c3, which are through holes other than the first through holes 2a into which the pins 10b are inserted.

First conductor lands 3a (3a1 to 3a3) are formed around the first through holes 2a. Second conductor lands 3b (3b1 to 3b3) are formed around the second through holes 2b. Third conductor lands 3c (3c1 to 3c5) are formed around the third through holes 2c.

The tuner 10 is mounted at the backside of the motherboard 1. The pins 10b are inserted into the through holes 2 so as to penetrate towards the front side. Accordingly, the first pins 10b6 to 10b8 positioned at one end of the line are inserted into the first through holes 2a1 to 2a3 and soldered to the corresponding first conductor lands 3a1 to 3a3. The pins other than the first pins 10b6 to 10b8, that is, the third pins 10b1 to 10b5, are inserted into the third through holes 2c1 to 2c5 and soldered to the corresponding third conductor lands 3c1 to 3c5.

A predetermined circuit 4 is formed on the motherboard 1. The first conductor lands 3a1 to 3a3 and the third conductor lands 3c1 to 3c5, which are connected to the pins 10b, are connected to corresponding portions of the predetermined circuit 4 by wiring conductors 5 (5-1 to 5-8). Of the conductor lands 3, the first conductor lands 3a1 to 3a3 corresponding to the first through holes 2a1 to 2a3 at the farthest end of the line are connected to the second conductor lands 3b1 to 3b3 by wiring conductors 6 (6-1 to 6-3).

Figure 2:
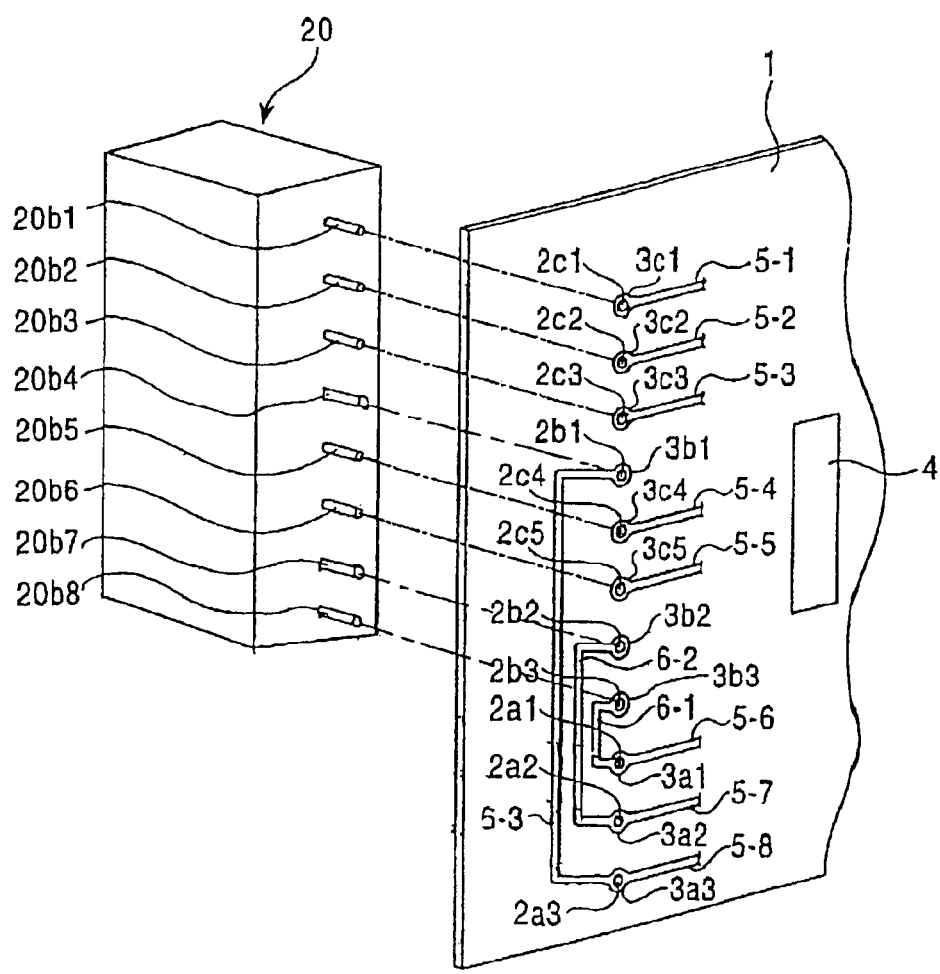
FIG. 2 is a perspective view of another television tuner to be mounted on the video-apparatus-tuner mounting board according to the present invention.

Arranged as described above, as shown in FIG. 2, when using another tuner 20, which has no pins corresponding to the positions of the first through holes 2a1 to 2a3 and which alternately has pins 20b1 to 20b8 at the positions of the second through holes 2b1 to 2b3, the pins 20b1 to 20b8 are inserted into the corresponding through holes 2c1 to 2c3, 2b1, 2c4, 2c5, 2b2, and 2b3 and soldered to the corresponding conductor lands 3. As a result, for example, the pin 20b4 of the other tuner 20 is connected to the predetermined circuit 4 through the conductor land 3b1, the wiring conductor 6-3, the conductor land 3a3, and the wiring conductor 5-8.

The appropriate provision of the pins 20b of the other tuner 20 at positions corresponding to the positions of open pins of the specific tuner 10 enables the motherboard 1 to be shared by the specific tuner 10 and the other tuner 20 without changing the motherboard 1.

In this case, since the other tuner 20 uses no first through holes 2a, the other tuner 20 can be miniaturized compared with the specific tuner 10.

Figure 3:
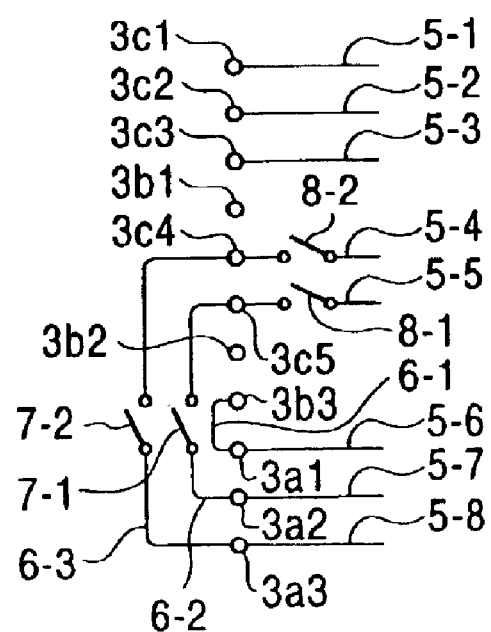
FIG. 3 is a circuit diagram showing the video-apparatus-tuner mounting board according to the present invention.
Figure 4:
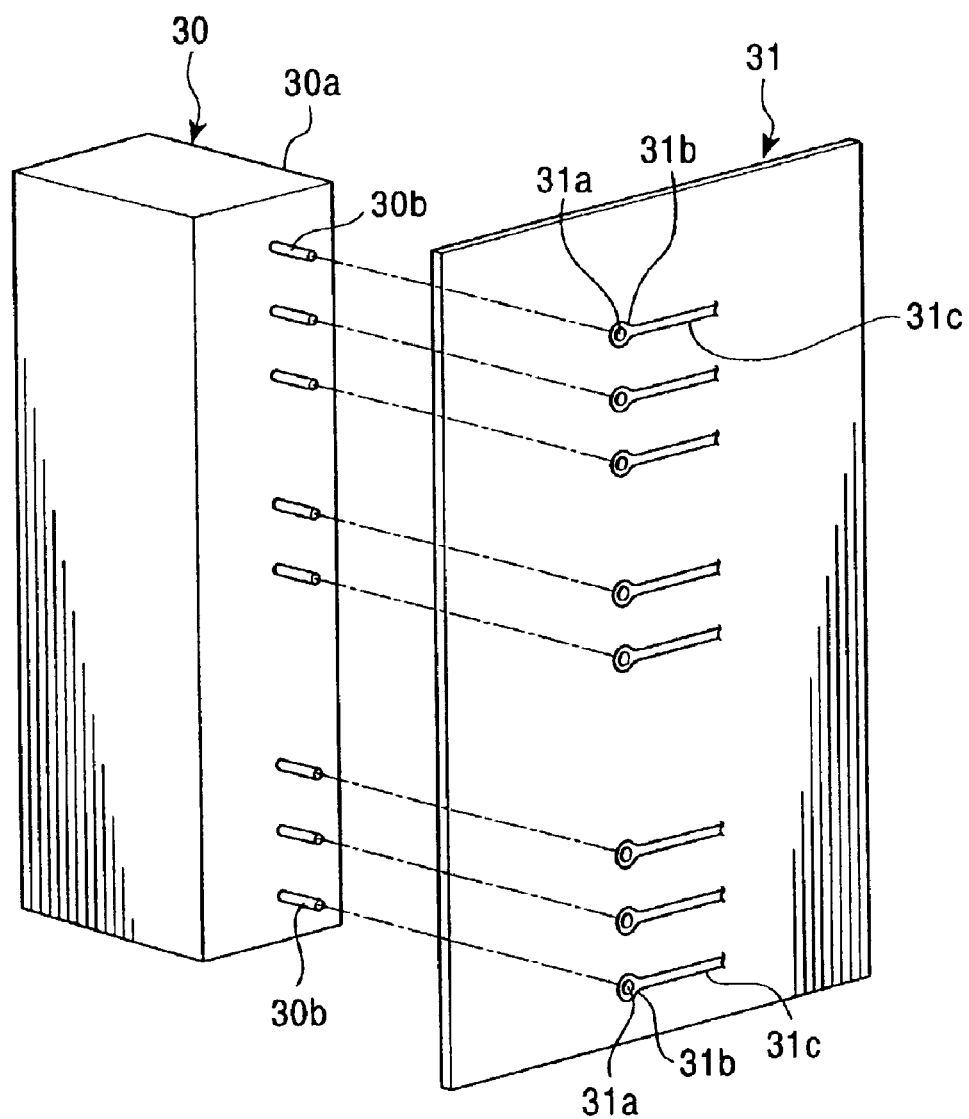
FIG. 4 is an exploded perspective view of a known video-apparatus-tuner mounting board.

FIG. 3 is a circuit diagram of another connection relationship among the conductor lands 3 of the motherboard 1. In the diagram, one conductor land 3a1 of the first conductor lands 3a is connected to one conductor land 3b3 of the second conductor lands 3b; the other two conductor lands 3a2 and 3a3 of the first conductor lands 3a are connected to the third conductor lands 3c5 and 3c4 through first switches 7-1 and 7-2, respectively, which are formed by switching diodes; and the third conductor lands 3c5 and 3c4 are connected to the predetermined circuit 4 through second switches 8-1 and 8-2, respectively, which are formed by switching diodes.

When using the specific tuner 10, the first switches 7-1 and 7-2 are opened, while the second switches 8-1 and 8-2 are closed. This enables the specific tuner 10 to be used. When using the other tuner 20, the first switches 7-1 and 7-2 are closed, while the second switches 8-1 and 8-2 are opened. As a result, the pins 20b5 and 20b6 of the other tuner 20 are connected to the predetermined circuit 4 through the conductor lands 3c4 and 3c5 and the conductor lands 3a3 and 3a2. Even when functions of a pin corresponding to the same mounting position differ among tuners, the same through hole and the corresponding conductor lands can be shared.

What is claimed is:

1. A video-apparatus-tuner mounting board, comprising:
a first television tuner mounted on the board;
a plurality of through holes arranged in a line; and
conductor lands formed around the plurality of through holes,
wherein, of the conductor lands, first conductor lands are connected to a predetermined circuit formed on the board and to second conductor lands,
wherein the first conductor lands are connected to pins connected to an internal circuit of the first television tuner, and the second conductor lands are not connected to the pins of the first television tuner, and
wherein the second conductor lands are connected to pins of a second television tuner when the second television tuner is mounted on the board.

2. The video-apparatus-tuner mounting board according to claim 1, wherein the plurality of the through holes corresponding to the first conductor lands is consecutively located at one end of the line.

3. A video-apparatus-tuner mounting board, comprising:
a first television tuner mounted on the board;
a predetermined circuit to be connected to pins connected to an internal circuit of the television tuner;
a plurality of through holes arranged in a line, into which the pins are inserted; and
conductor lands, formed around the plurality of through holes, to be connected to the pins,
wherein, of the conductor lands, first conductor lands connected to the pins of a second television tuner to be mounted on the board are connected to the predetermined circuit, and connected via first switch means units connect correspondingly first conductor lands to third conductor lands connected to the pins of the second television tuner,
the third conductor lands are connected to the predetermined circuit via second switch units, and
an opening and closing operation of the first switch units is opposite from that of the second switch units.

4. The video-apparatus-tuner mounting board according to claim 3, wherein the plurality of the through holes corresponding to the first conductor lands is consecutively located at one end of the line.

* * * * *